United States Patent

Wheatley, Jr.

[15] 3,688,153

[45] Aug. 29, 1972

[54] DEFLECTION CIRCUIT

[72] Inventor: Carl Franklin Wheatley, Jr., Somerset, N.J.

[73] Assignee: RCA Corporation

[22] Filed: April 2, 1970

[21] Appl. No.: 25,100

[52] U.S. Cl. ................................315/27 TD, 307/300

[51] Int. Cl. ..............................................H01j 29/76

[58] Field of Search ...........315/27 TD; 307/280, 300

[56] References Cited

UNITED STATES PATENTS

| | | | |
|---|---|---|---|
| 3,343,061 | 9/1967 | Hetterscheid et al | 315/27 TD |
| 3,105,159 | 9/1963 | Ditkofsky | 307/300 X |
| 3,501,671 | 3/1970 | Buechel | 315/27 TD |
| 3,534,281 | 10/1970 | Hillhouse | 307/300 X |

*Primary Examiner*—Benjamin A. Borchelt
*Assistant Examiner*—R. Kinberg
*Attorney*—Eugene M. Whitacre

[57] ABSTRACT

A unidirectional conductive device is coupled from a base terminal to a collector terminal of a horizontal deflection output transistor in a television receiver and poled in a direction to prevent the transistor from saturating when it is driven into its conductive state during a portion of each deflection cycle. Biasing means is coupled to the diode to preselect the desired operating voltage of the transistor during its conduction period.

3 Claims, 4 Drawing Figures

Figures 1, 2:
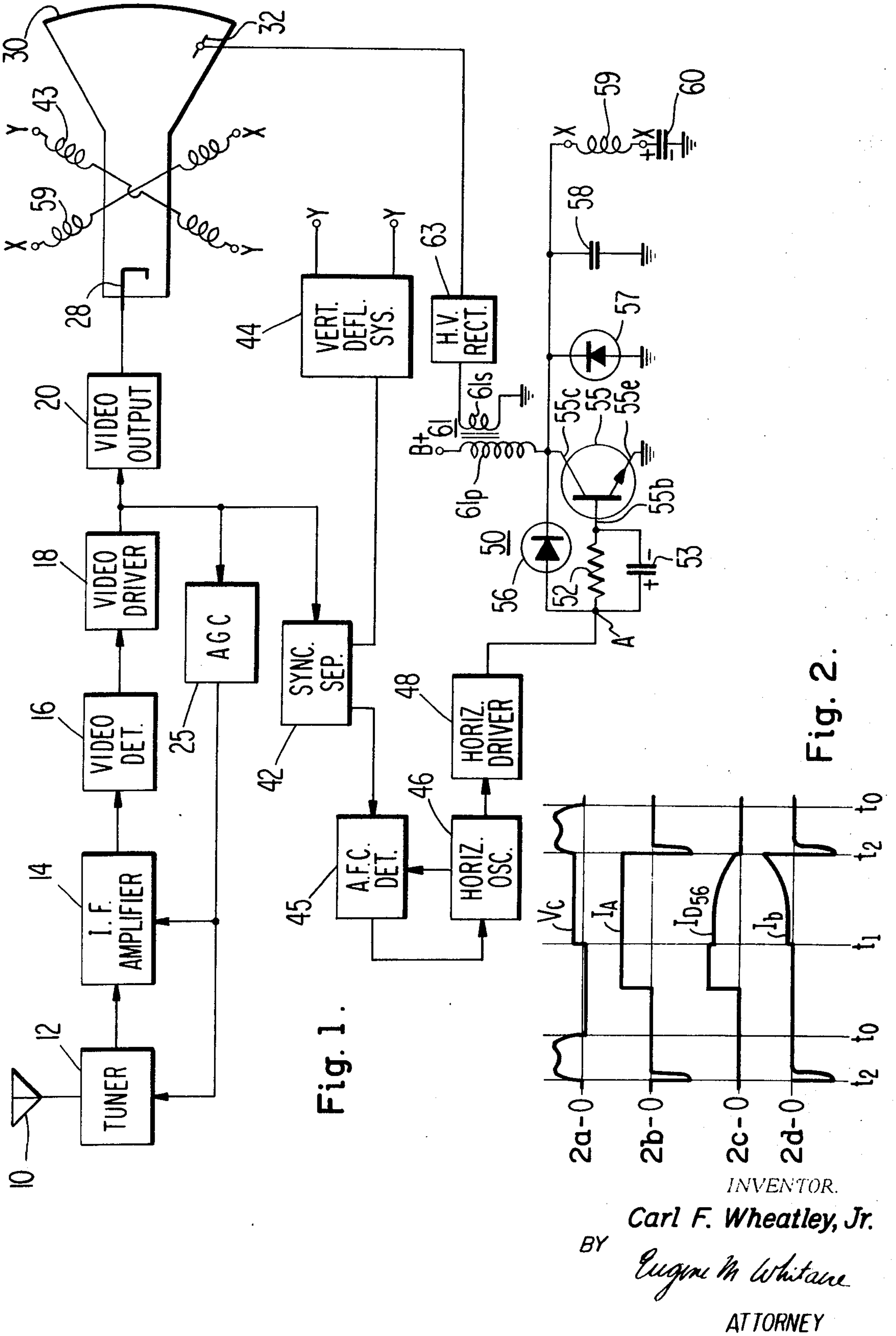

INVENTOR.

Carl F. Wheatley, Jr.

BY Eugene M. Whitacre

ATTORNEY

INVENTOR
Carl F. Wheatley, Jr.
BY
Eugene M. Whitacre
ATTORNEY

DEFLECTION CIRCUIT

The present invention relates to transistorized deflection circuits utilized in television receivers.

In present day transistor deflection circuits, for example, those used in the horizontal output stage of a television receiver; the output transistor is normally operated in a switching mode, that is, the transistor is driven into saturation during a trace interval of each deflection cycle and driven out of conduction during the retrace portion of each deflection cycle. By operating the transistor in its saturation region, average power losses are minimized. With saturated operation, however, the accumulation of minority carriers in the base region will effect a continuation in the flow of collector current after the trace interval during the initial portion of the retrace interval while the transistor is being driven into its non-conducting state. In addition to causing this undesirable delay time in turning off the transistor, losses occurring during this period may be localized in small areas commonly referred to as "hot spots." These losses are characterized in being regenerative and tend to cause second breakdown of the device. This effect is explained in greater detail in a paper authored by the present inventor and entitled "Thermal Regeneration in Power Dissipating Elements" which appeared in " The Electronic Engineer" publication in the January 1967 issue. Although operating the horizontal output transistor in its saturated region may reduce the average power dissipated in this device during its conduction interval, it increases the possibility of second breakdown during the turn-off time. With the advent of high voltage (1,500 volts) transistors, it is possible to develop the necessary output energy utilizing one of these transistors which can be operated in a non-saturated mode. The circuit of the present invention insures that the deflection output transistor will not be driven into saturation.

Certain low power transistor switching circuits, such as employed in computer applications, have utilized diodes in conjunction with resistive biasing means coupled between the base and collector terminals to prevent the transistor from saturating and thereby increase the maximum switching frequency of the circuit by reducing the turn-off time of the device.

In the solid state deflection art, however, it is desirable to reduce the turn-off time of the device not to increase the frequency of operation of the circuit, but rather to prevent second breakdown of the device as the relatively large inductive voltage pulse appears during the initial portion of the flyback interval, when current flowing through the deflection winding is interrupted to initiate the retrace portion of each deflection cycle.

The non-saturated operation of the deflection output transistor is achieved in circuits embodying the present invention by automatically holding the collector voltage above the saturation level by shunting excess base drive from the base to emitter junction into the collector circuit. Prior transistor deflection systems employ only the saturated operation of the deflection output device.

Circuits embodying the present invention include a deflection output transistor having a diode coupled between its base and collector terminals and poled to prevent the transistor from being driven into saturation during its conduction period of each deflection cycle.

The invention can be more fully understood by referring to the drawings together with the description below and the accompanying claims.

Figure 3:
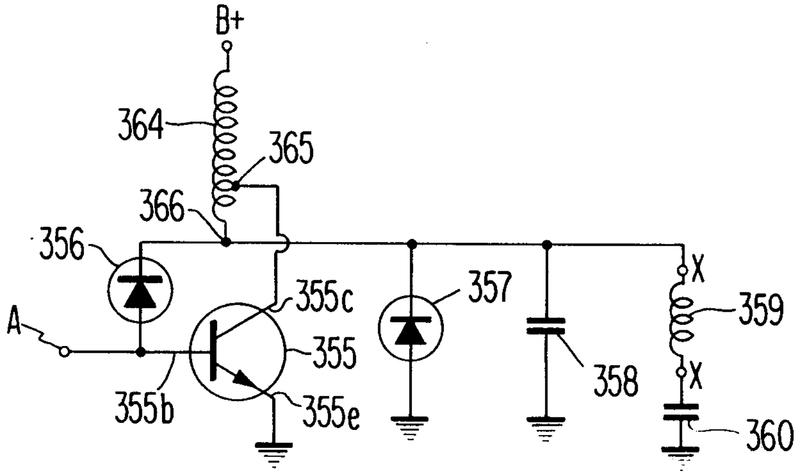

In the drawings:

FIG. 1 illustrates in block and schematic diagram form, a television receiver including a solid state deflection output stage embodying the present invention;

FIG. 2*a* is a waveform diagram of the voltage present at the collector terminal 55*c* of transistor 55 in FIG. 1;

FIG. 2*b* shows the drive current to terminal A in FIG. 1;

FIG. 2*c* is a waveform diagram of the current in diode 56 in FIG. 1;

FIG. 2*d* is a waveform diagram of the base current flowing in transistor 55 of FIG. 1;

FIG. 3 is a schematic diagram of an alternative embodiment of the present invention;

FIG. 4*a* is a waveform diagram of the voltage appearing at the terminal 366 in FIG. 3;

FIG. 4*b* is a waveform diagram of the drive current to terminal A in FIG. 3;

FIG. 4*c* is a waveform diagram of the current in diode 356 in FIG. 3; and FIG. 4*d* is a waveform diagram of the base drive current to transistor 355 in FIG. 3.

Referring specifically to FIG. 1, an antenna 10 receives television signals and couples these signals to a tuner 12 which selects the desired radio frequency signals of a predetermined broadcast channel, amplifies these signals, and converts the amplified radio frequency signals to a lower intermediate frequency (I.F.). The tuner 12 is coupled to an I.F. amplifier 14 which amplifies the intermediate frequency signals. The I.F. amplifier 14 is coupled to a video detector 16 which derives video information from the I.F. signals. The video detector 16 is coupled to a video driver stage 18 which amplifies the video signals. The video driver stage 18 is coupled to a video output stage 20, an automatic gain control stage 25 and a synchronizing separator stage 42. An output signal from video driver stage 18 may also be coupled to a sound channel (not shown) to reproduce the audio portion of the transmitted television program. The video output stage 20 couples amplified video information to a control element, such as a cathode 28, of a kinescope 30.

The automatic gain control stage 25 operates in a conventional manner to provide gain control signals which are applied to a radio frequency amplifier included in tuner 12 and to the I.F. amplifier 14. Sync separator 42 separates the synchronization information from the video information and also separates the horizontal synchronizing information for the vertical synchronizing information. The vertical synchronizing pulses derived from sync separator 42 are applied to the vertical deflection system 44 which provides the required deflection current to a vertical deflection winding 43 associated with kinescope 30 by means of the interconnection Y—Y. The horizontal synchronizing pulses from sync separator 42 are applied to an automatic frequency control detector 45 which serves to synchronize a horizontal oscillator 46 with the horizontal synchronizing pulses. The horizontal oscillator stage 46 is coupled to a horizontal driver stage 48 which develops the required drive signal and may be coupled by means of an output transformer in stage 48 (not shown) to a transistorized horizontal output stage 50. The transformer secondary, coupled to terminal A, provides a direct current path for the drive current.

The horizontal output stage 50 includes an output transistor 55 having a base, a collector and an emitter terminal **55*b*, 55*c* and 55*e*, respectively. A resistor 52 and a capacitor 53 are coupled in parallel between the horizontal driver stage 48 and the base terminal 55*b* of transistor 55**.

The output stage includes a unidirectional conductive device such as a diode 56 coupled between the base and collector terminals **55*b* and 55*c* of transistor 55. Stage 50 also includes a damper diode 57 coupled across transistor 55, a retrace capacitor 58 coupled across transistor 55 and the series combination of a horizontal deflection winding 59 and an S-shaping capacitor 60 also coupled across transistor 55. Output stage 50 also includes a flyback transformer 61 with a primary winding 61*p* coupled from a source of operating potential (B+) to the collector terminal 55*c* of transistor 55. A secondary winding 61*s* on transformer 61 develops high voltage pulses which are coupled to a high voltage rectifier 63 to provide the ultor voltage for application to a terminal 32 on kinescope 30. Flyback transformer 61 may also include additional windings (not shown) for providing, for example, keying pulses to the AGC stage 25**.

The output stage 50 in FIG. 1 is a conventional shunt fed trace driven circuit with the exception of the diode 56 and the bias network including resistor 52 and capacitor 53. Beginning at the center of the trace interval of the deflection cycle, the yoke current is zero and capacitor 60 has a maximum charge. The drive signal applied to the base terminal **55*b* of transistor 55 turns this device on, thereby completing the conduction path for yoke current which includes capacitor 60, yoke 59 and the collector to emitter current path through transistor 55. During this portion of scan the yoke current is supplied by the charge on capacitor 60 and increases to a maximum value in one direction at which time scan retrace is initiated by driving transistor 55 out of conduction by applying an appropriate signal from the driver stage 48 to the base 55*b* of transistor 55. During the latter portion of the trace interval when the magnitude of the yoke current is increasing, the output transistor of prior circuits is normally driven into saturation and is in this conduction state at the instant retrace is initiated. During the first portion of retrace, the yoke current is at a maximum and resonates with the retrace capacitor 58 by charging capacitor 58 in a polarity to reverse bias the damper diode 57. As the yoke current decreases to zero, capacitor 58 has a maximum charge impressed upon it; and during the second portion of retrace, the capacitor (58) drives current through the yoke in a reverse direction until it is discharged and the voltage across it reverses sufficiently to forward bias damper diode 57. Diode 57 then conducts during this first portion of trace to complete the current path for yoke current which is, at this instant, at a maximum value in a direction in yoke 59 to charge capacitor 60 and is increasing toward zero. At the mid-point of trace the yoke current has reached zero and the cycle is completed by driving transistor 55** into conduction once again.

Turning now to the operation of the circuitry of FIG. 1 including the present invention, reference is made to the waveform diagrams of FIG. 2. The initial portion of trace is represented in FIG. 2 by the time period between $t_0$ and $t_1$ in the figure. It is recalled that during this period damper diode 57 is conducting. The voltage at collector terminal **55*c* of transistor 55 is represented by the voltage waveform ($V_c$) in FIG. 2*a* and is equal to the forward voltage drop across diode 57 which is of the order of −0.7 volts. At some non-critical time before $t_1$, the horizontal driver 48 provides a drive current ($I_A$), as is shown in FIG. 2*b*. This current flows through diode 56 as is illustrated in FIG. 2*c*, since the diode is forward biased. [The cathode of diode 56 is at the same voltage as collector terminal 55*c* (−0.07 volts) and the drive current produces a positive voltage at point A which is at the anode of diode 56.] As time $t_1$ (the center of trace) is reached, damper diode 57 turns off allowing the collector voltage on transistor 55 to increase as shown in FIG. 2*a*. At the same time, a portion of the drive current flowing into terminal A is conducted by the now forward biased base to emitter junction of transistor 55 as is illustrated by the waveform of FIG. 2*d*. Transistor 55 is now conducting the increasing yoke current during the latter portion of scan represented by the period from $t_1$ to $t_2$ in FIG. 2. As the magnitude of the yoke current increases during the $t_1$ to $t_2$ interval, the base current in transistor 55 increases as shown in FIG. 2*d*. Diode 56 conducts as illustrated in FIG. 2*c* to shunt the remaining portion of the applied drive current at terminal A. It is noted that the sum of the currents shown in FIGS. 2*c* and 2*d* will equal the current shown in FIG. 2*b*. The values of resistor 52 and capacitor 53 can be selected to hold the transistor collector voltage at a preselected value sufficient to prevent saturation of the transistor 55. If, for example, the voltage across capacitor 53 is 5.3 volts, the voltage at terminal A with respect to ground will be approximately 6 volts (5.3 volts plus the forward voltage drop across the base-emitter junction of transistor 55). The collector voltage will then be approximately equal to the voltage at terminal A less the forward voltage drop across diode 56. It is desirable to choose values of resistor 52 and capacitor 53 to operate transistor 55** near but not into the saturation region of conduction during the latter portion of each trace interval.

At time $t_2$ retrace is initiated by applying a relatively large negative drive signal as shown in FIG. **2*b* to the base terminal of transistor 55. During the retrace interval ($t_2$ to $t_0$ in FIG. 2), the collector voltage increases in a typical manner as illustrated in FIG. 2*a***. At time $t_0$ the cycle is again repeated.

The circuit modification illustrated in FIG. 3 is another embodiment of the invention which reduces the change in voltage applied to the yoke 59 of FIG. 1 at time $t_1$. As shown in FIG. **2*a*, when diode 57 turns off and transistor 55 conducts, the voltage at the collector terminal 55*c* of transistor 55 changes by as much, for example, as 6 volts. This voltage change, which is coupled to the yoke 59, will vary the rate of change of yoke current during the center of trace and may, in certain circuits, cause an undesirable non-linearity in the scanning rate. As FIG. 4*a* illustrates, the circuit of FIG. 3** reduces this change in voltage at the mid-point of trace ($t_1$).

Figure 4:
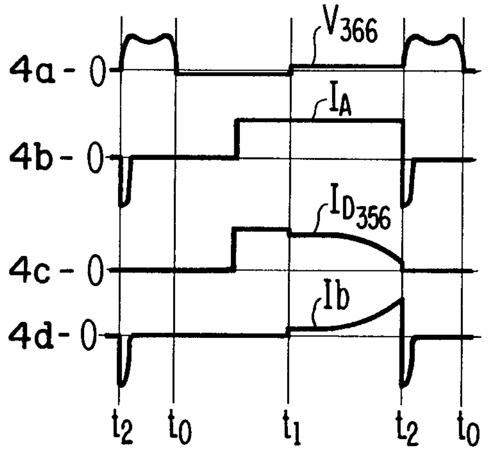

Referring to FIG. 3, the circuit elements which correspond to those of FIG. 1 are prefaced by the numeral 3. In explaining FIG. 3, it is helpful to refer to the waveform diagrams of FIG. 4. Transformer 364 in FIG. 3 is a tightly coupled auto-transformer wherein the tap point 365 may be, for example, at the 5 percent point on the transformer. That is, the segment between terminals 365 and 366 contain 5 percent of the total number of windings on transformer 364. Transformer 364 may also include a secondary winding such as the high voltage winding which is not shown in the figure. In operation, as drive current is applied at sometime prior to $t_1$ as is shown in FIG. 4*b*, damper diode 357 is conducting and the voltage at terminal 366 is therefore at approximately −0.7 volts. Drive current flowing into terminal A as represented in FIG. 4b will be conducted by diode 356 during this interval as indicated by the diode current waveform in FIG. 4*c*. At the middle portion of trace ($t_1$), the damper diode turns off and voltage at terminal 366 is thereby allowed to go slightly positive (less than 0.7 volts). The collector voltage of transistor 355 is held at a value of approximately 5 volts (assuming, for example, the B+ voltage is equal to 100 volts and the collector is coupled to the tap 365 on transformer 364 at a 5 percent point). At this instant, the base to emitter junction will be forward biased and transistor 355 conducts. It is seen that the anode voltage of diode 356 is at approximately +0.7 volts and its cathode which is coupled to terminal 366 is at a less positive voltage. Diode 356 begins to conduct during the latter portion of trace as illustrated by the current waveform diagram shown in FIG. 4*c*.

During the latter portion of trace, the transistor tends to saturate and the collector voltage at terminal 355*c* tends to decrease. As this occurs, more current will flow from the B+ terminal through the upper portion of transformer 364. Due to the relatively tight coupling of the segments of transformer 364, terminal 366 experiences a decrease in voltage which controls the forward bias applied to diode 356 to shunt sufficient drive current to hold the transistor 355 out of saturation. The collector voltage of transistor 355 is thus held at some preselected value depending on the location of tap point 365 on transformer 364. Since transformer 364 is utilized, terminal 366 will remain at a low voltage during the latter portion of trace as shown in FIG. 4*a*, and diode 356 will be forward biased during the application of a positive drive signal to terminal A. As before, the base drive current will increase and diode 356 conduction will decrease generally as shown in FIGS. 4*c* and 4*d* during the latter portion of trace. At time $t_2$ in FIG. 4, a negative drive pulse is applied to the circuit which initiates the retrace interval of the deflection cycle.

Although the specific embodiments of the invention are illustrated in the horizontal deflection output stage of a black and white television receiver, the invention has equal applicability to other deflection systems and may be utilized in a color television receiver.

What is claimed is:

1. In a television receiver, a deflection circuit comprising:

a transistor having base, collector and emitter terminals;

a source of drive signals coupled to said base terminal;

a source of operating current, a transformer including first, second and third terminals wherein said first terminal is coupled to said source of operative current and said second terminal is coupled to said collector terminal of said transistor;

a damper diode coupled from a reference potential to said third terminal on said transformer and poled to conduct during the first portion of the trace interval of each deflection cycle;

a deflection winding capacitively coupled from said reference potential to said third terminal on said transformer;

a retrace capacitor coupled to said deflection winding and resonant therewith during a retrace interval of each deflection cycle, and unidirectional conductive device means coupled from said base terminal on said transistor to said third terminal on said transformer and poled to conduct when the voltage at said second terminal falls below a preselected level, thereby clamping said collector voltage of said transistor at a level selected to be higher than the saturation voltage of said transistor.

2. A circuit as defined in claim 1 wherein said transformer is an auto-transformer and said second terminal is intermediate said first and third terminals.

3. In a television receiver, a deflection circuit comprising:

a transistor having base, collector and emitter terminals;

a source of drive signals coupled to said base terminal;

a source of operating current;

a transformer including first, second and third terminals wherein said first terminal is coupled to said source of operative current and said second terminal is coupled to said collector terminal of said transistor; a deflection winding coupled between said collector and emitter electrodes; and unidirectional conductive device means coupled from said base terminal on said transistor to said third terminal on said transformer and poled to conduct when the voltage at said second terminal falls below a preselected level, thereby clamping said collector voltage of said transistor at a level selected to be higher than the saturation voltage of said transistor.

* * * * *